US009513352B2

(12) United States Patent
Bulumulla et al.

(10) Patent No.: US 9,513,352 B2
(45) Date of Patent: Dec. 6, 2016

(54) SYSTEM AND METHOD FOR INDUCTIVELY COMMUNICATING DATA

(71) Applicant: General Electric Company, Schenectady, NY (US)

(72) Inventors: Selaka Bandara Bulumulla, Niskayuna, NY (US); Christopher Judson Hardy, Schenectady, NY (US); Karthikeyan Veeraswamy Sathyamurthy, Bangalore (IN)

(73) Assignee: General Electric Company, Niskayuna, NY (US)

( * ) Notice: Subject to any disclaimer, the term of this patent is extended or adjusted under 35 U.S.C. 154(b) by 1105 days.

(21) Appl. No.: 13/629,636

(22) Filed: Sep. 28, 2012

(65) Prior Publication Data

US 2014/0091791 A1    Apr. 3, 2014

(51) Int. Cl.
*G01R 33/3415*    (2006.01)
*G01R 33/54*    (2006.01)
*G01R 33/36*    (2006.01)

(52) U.S. Cl.
CPC ....... *G01R 33/3642* (2013.01); *G01R 33/3692* (2013.01); *G01R 33/3415* (2013.01)

(58) Field of Classification Search
CPC ............ G01R 33/3415; G01R 33/3642; G01R 33/3692
USPC ........................... 324/307–309, 313, 318–22
See application file for complete search history.

(56) References Cited

U.S. PATENT DOCUMENTS

| 5,274,332 | A | * | 12/1993 | Jaskolski | G01R 33/34007 |
| | | | | | 324/318 |
| 2004/0021470 | A1 | | 2/2004 | Adams et al. | |
| 2004/0178641 | A1 | | 9/2004 | Wall | |
| 2005/0254191 | A1 | | 11/2005 | Bashaw et al. | |
| 2006/0004531 | A1 | | 1/2006 | Ye et al. | |
| 2007/0103004 | A1 | | 5/2007 | Chou et al. | |
| 2008/0122293 | A1 | | 5/2008 | Ohm | |
| 2009/0315556 | A1 | * | 12/2009 | Driemel | G01R 33/3415 |
| | | | | | 324/307 |

(Continued)

OTHER PUBLICATIONS

Yuan et al, "An Improved Islanding Detection Method for Grid-Connected Photovoltaic Inverters", Power Engineering Conference, 2007. IPEC 2007. International, Print ISBN: 978-981-05-9423-7, On pp. 538-543, References Cited: 20, Issue Date : Dec. 3-6, 2007.

*Primary Examiner* — Melissa Koval
*Assistant Examiner* — Rishi Patel
(74) *Attorney, Agent, or Firm* — Melissa K. Dobson (57) ABSTRACT

A system for inductively communicating signals in a magnetic resonance imaging system is presented. The system includes first array of primary coils configured to acquire data from a patient positioned on a patient cradle. Furthermore, the system includes a second array of secondary coils operatively coupled to the first array of primary coils. Moreover, the system includes a third array of tertiary coils disposed at a determined distance from the second array of secondary coils. In addition, the system includes a tuning unit operatively coupled to the third array of tertiary coils by a cable having a quarter-wave electrical wavelength and configured to control the first array of primary coils through impedance transformation, where the second array of secondary coils is configured to inductively communicate the acquired data to the third array of tertiary coils.

30 Claims, 6 Drawing Sheets

(56) References Cited

U.S. PATENT DOCUMENTS

| | | |
|---|---|---|
| 2011/0115301 A1 | 5/2011 | Bhavaraju et al. |
| 2011/0164440 A1 | 7/2011 | Krein |
| 2011/0187200 A1 | 8/2011 | Yin et al. |
| 2012/0032678 A1* | 2/2012 | Vaughan, Jr. ...... G01R 33/3415 324/318 |
| 2012/0062232 A1* | 3/2012 | Matschl ............. G01R 33/3415 324/318 |
| 2012/0161767 A1* | 6/2012 | Hardy .................. H04B 5/0093 324/318 |
| 2013/0320982 A1* | 12/2013 | Bulumulla ....... G01R 33/34007 324/318 |

* cited by examiner

SYSTEM AND METHOD FOR INDUCTIVELY COMMUNICATING DATA

BACKGROUND

Embodiments of the present disclosure relate to communication of signals, and more particularly to the inductive communication of signals in an imaging system.

In just a few decades, the use of magnetic resonance imaging (MRI) scanners has grown tremendously. MRI scans are being increasingly used to aid in the diagnosis of multiple sclerosis, brain tumors, torn ligaments, tendonitis, cancer, strokes, and the like. As will be appreciated, MRI is a noninvasive medical test that aids physicians in the diagnoses and treatment of various medical conditions. The enhanced contrast that an MRI scan provides between the different soft tissues of the body allows physicians to better evaluate the various parts of the body and determine the presence of certain diseases that may not be assessed adequately with other imaging methods such as X-ray, ultrasound, or computed tomography (CT).

An MRI system typically includes one or more coils to generate the magnetic field. Additionally, the MRI system also includes one or more MRI receiver coils configured to detect signals from a gyromagnetic material within a patient. These MRI receiver coil arrays typically entail use of bulky cables. Use of these bulky cables increases the difficulty in situating the receiver coils over the patient before the scanning procedure. Furthermore, the advent of parallel imaging has led to the increase in the number of MRI receiver channels. Unfortunately, this increase in the number of receiver channels has further exacerbated the problem with a corresponding increase in the number of bulky cables.

Some currently available techniques call for embedding a subset of the coils in the cradle underneath the patient. However, each coil is attached to a preamplifier, a cable, and baluns, all of which must be accommodated in the cradle. Cables also increase the weight of the anterior arrays that are positioned on the patient, thereby causing discomfort to the patient. Moreover, the cables also increase time and complexity of the scanning procedure, with decreased patient throughput as these cables need to be plugged in and connections need to be verified prior to the scanning procedure. In addition, these techniques may also call for the use of a switch or a multiplexer to connect different subsets of coils to receiver electronics as different portions of the anatomy are scanned.

Certain other demonstrated techniques entail the use of microwave or optical links to acquire signals without the use of cables. In these methods, the signal from each coil is amplified and then converted to an optical or microwave signal which is then beamed through space to a receiver in the scanner bore or outside the bore. The signal may or may not be demodulated to a different frequency and/or digitized before conversion. However, these signal conversions require placement of additional circuits on the coils, which can substantially increase the amount of power required by the coils, and lead to increased heat generation on the coils. The additional circuitry can also add to the weight and bulk of the coil arrays, and can potentially interfere with the radiofrequency (RF) fields being detected by the coils.

Moreover, some other currently available techniques call for positioning a posterior array at a fixed location under the cradle. Although these methods reduce the number of coils and associated hardware, these methods can result in significant loss in signal-to-noise ratio (SNR). Additionally, certain other demonstrated techniques inductively couple the receive coils to anterior arrays using patient-bed coupling elements that are attached to the local imaging coils by internal cabling, and are inductively coupled to base coupling elements positioned at the sides of the cradle. However, the relatively large size of the coupling elements and the limited space at the side of the cradle limit the versatility of this approach, thereby making it hard to use these techniques with large arrays. In other techniques, the sniffer coils are fixedly coupled to the imaging system, thereby reducing the flexibility of the system during the scanning procedure. Also, induced voltages can lead to patient heating.

BRIEF DESCRIPTION

In accordance with aspects of the present disclosure, a system for inductively communicating signals in a magnetic resonance imaging system is presented. The system includes first array of primary coils configured to acquire data from a patient positioned on a patient cradle. Furthermore, the system includes a second array of secondary coils operatively coupled to the first array of primary coils. Moreover, the system includes a third array of tertiary coils disposed at a determined distance from the second array of secondary coils. In addition, the system includes a tuning unit operatively coupled to the third array of tertiary coils by a cable having a quarter-wave electrical wavelength and configured to control the first array of primary coils through impedance transformation, where the second array of secondary coils is configured to inductively communicate the acquired data to the third array of tertiary coils.

In accordance with another aspect of the present disclosure, a method for inductively communicating signals in a magnetic resonance imaging system is presented. The method includes disposing a first array of primary coils on or about a patient, where the first array of primary coils is configured to acquire signals from the patient positioned on a patient cradle. Additionally, the method includes operatively coupling a second array of secondary coils to the first array of primary coils. The method also includes disposing a third array of tertiary coils on the patient cradle such that the third array of tertiary coils is disposed at a determined distance from the second array of secondary coils. Moreover, the method includes inductively communicating the signals acquired by the first array of primary coils from the second array of secondary coils to the third array of tertiary coils.

In accordance with yet another aspect of the present disclosure, a system for a magnetic resonance imaging is presented. The system includes an acquisition subsystem configured to acquire image data, where the acquisition subsystem includes a subsystem for inductively communicating data signals in the imaging system, where the subsystem includes a first array of primary coils configured to acquire data from a patient positioned on a patient cradle, a second array of secondary coils operatively coupled to the first array of primary coils, a third array of tertiary coils disposed at a determined distance from the second array of secondary coils, a tuning unit operatively coupled to the third array of tertiary coils by a cable having a quarter-wave electrical wavelength and configured to control the first array of primary coils through impedance transformation, where the second array of secondary coils is configured to inductively communicate the acquired data to the third array of tertiary coils. Moreover, the system includes a processing subsystem in operative association with the acquisition subsystem and configured to process the acquired image data.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As will be described in detail hereinafter, a method for inductively communicating data and various embodiments of systems for inductively communicating data are presented. By employing the method and systems for inductively communicating data described hereinafter, system size and complexity may be minimized, while enhancing the performance of the system and achieving a higher patient throughput.

Figure 1:
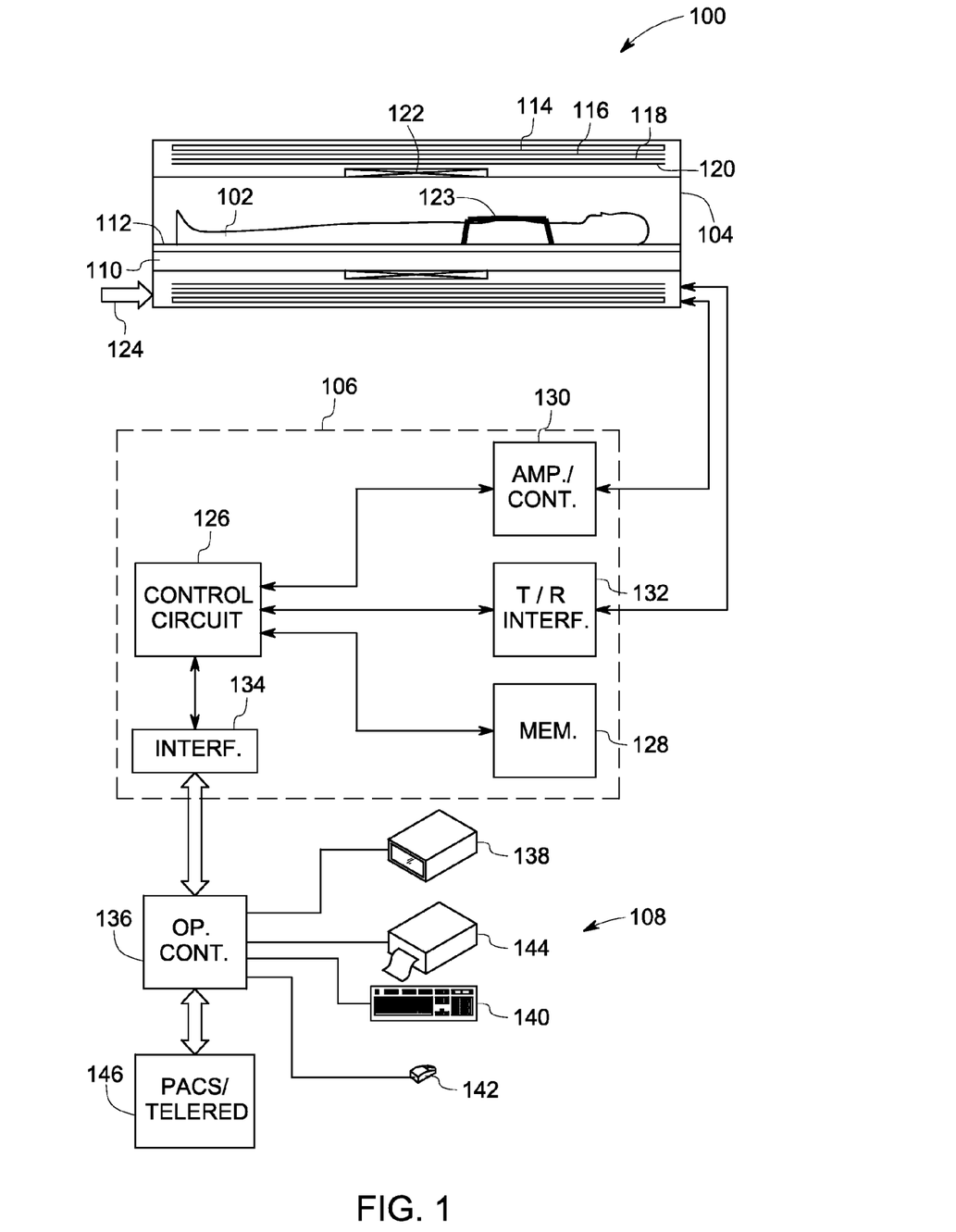
FIG. 1 is a block diagram illustration of an exemplary imaging system in the form of a magnetic resonance imaging (MRI) system configured to use the systems and methods of FIGS. 2-6.

Turning now to the drawings, and referring to FIG. 1, a block diagram of an embodiment of an MRI imaging system 100 is depicted. The MRI system 100 is illustrated diagrammatically as including a scanner 104, scanner control circuitry 106, and system control circuitry 108. While the MRI system 100 may include any suitable MRI scanner or detector, in the illustrated embodiment the system 100 includes a full body scanner including a patient bore 110 into which a cradle 112 may be positioned to place a patient 102 in a desired position for scanning. The scanner 104 may be of any suitable field strength, including scanners varying from 0.5 Tesla to 3 Tesla and beyond. As used herein, the term patient is used to refer to a human person or an animal that is the subject of the imaging application.

Additionally, the scanner 104 may include a series of associated coils for producing controlled magnetic fields, for generating radio-frequency (RF) excitation pulses, and for detecting emissions from gyromagnetic material within the patient 102 in response to such pulses. In the diagrammatical view of FIG. 1, a primary magnet coil 114 may be provided for generating a primary magnetic field generally aligned with patient bore 110. A series of gradient coils 116, 118 and 120 may be grouped in a coil assembly for generating controlled magnetic field gradients during examination sequences as will be described in greater detail hereinafter. A RF coil 122 may be provided for generating radio frequency pulses for exciting the gyromagnetic material. In the embodiment illustrated in FIG. 1, the coil 122 also serves as a receiving coil. Thus, the RF coil 122 may be coupled with driving and receiving circuitry in passive and active modes for receiving emissions from the gyromagnetic material and for applying RF excitation pulses, respectively. Alternatively, various configurations of receiving coils may be provided separate from the RF coil 122. Such coils may include structures specifically adapted for target anatomies, such as head coil assemblies, and so forth. In one example, an anterior array of coils 123 may be provided. Moreover, this anterior array of coils 123 may be disposed on or about the patient 102. In addition, receiving coils may be provided in any suitable physical configuration, including phased array coils, and so forth.

In a presently contemplated configuration, the gradient coils 116, 118 and 120 may have different physical configurations adapted to their function in the imaging system 100. As will be appreciated by those skilled in the art, the coils include conductive wires, bars or plates that are wound or cut to form a coil structure that generates a gradient field upon application of control pulses as described below. The placement of the coils within the gradient coil assembly may be done in several different orders. In one embodiment, a Z-axis coil may be positioned at an innermost location, and may be formed generally as a solenoid-like structure that has relatively little impact on the RF magnetic field. Thus, in the illustrated embodiment, the gradient coil 120 is the Z-axis solenoid coil, while coils 116 and 118 are Y-axis and X-axis coils respectively.

The coils of the scanner 104 may be controlled by external circuitry to generate desired fields and pulses, and to read signals from the gyromagnetic material in a controlled manner. As will be appreciated by those skilled in the art, when the material, typically bound in tissues of the patient 102, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, an RF frequency pulse is generated at or near the Larmor frequency of the material of interest, resulting in rotation of the net aligned moment to produce a net transverse magnetic moment. This transverse magnetic moment precesses around the main magnetic field direction, emitting RF signals that are detected by the scanner 104 and processed for reconstruction of the desired image.

The gradient coils 116, 118 and 120 may be configured to serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two. The three coils have mutually orthogonal axes for the direction of their variation, enabling a linear field gradient to be imposed in an arbitrary direction with an appropriate combination of the three gradient coils.

The pulsed gradient fields perform various functions integral to the imaging process. Some of these functions are slice selection, frequency encoding and phase encoding. These functions may be applied along the X-axis, Y-axis and Z-axis of the original coordinate system or along other axes determined by combinations of pulsed currents applied to the individual field coils.

The slice select gradient determines a slab of tissue or anatomy to be imaged in the patient 102. The slice select gradient field may be applied simultaneously with a frequency selective RF pulse to excite a known volume of spins within a desired slice that precess at the same frequency. The slice thickness is determined by the bandwidth of the RF pulse and the gradient strength across the field of view.

The frequency encoding gradient is also known as the readout gradient, and is usually applied in a direction perpendicular to the slice select gradient. In general, the frequency encoding gradient is applied before and during the formation of the magnetic resonance (MR) echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction may be accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

As will be appreciated by those skilled in the art, a great number of variations may be devised for pulse sequences employing the exemplary gradient pulse functions described hereinabove as well as other gradient pulse functions not explicitly described here. Moreover, adaptations in the pulse sequences may be made to appropriately orient both the selected slice and the frequency and phase encoding to excite the desired material and to acquire resulting MR signals for processing.

The coils of the scanner 104 are controlled by the scanner control circuitry 106 to generate the desired magnetic field and RF pulses. In the diagrammatical view of FIG. 1, the scanner control circuitry 106 thus includes a control circuit 126 for commanding the pulse sequences employed during the examinations, and for processing received signals. The control circuit 126 may include any suitable programmable logic device, such as a CPU or digital signal processor of a general purpose or application-specific computer. Also, the control circuit 126 may further include memory circuitry 128, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 126 and the coils of the scanner 104 is managed by amplification and control circuitry 130 and by transmission and receive interface circuitry 132. The amplification and control circuitry 130 includes amplifiers for each gradient field coil to supply drive current to the field coils in response to control signals from the control circuit 126. The transmit/receive (T/R) circuitry 132 includes additional amplification circuitry for driving the RF coil 122. Moreover, where the RF coil 122 serves both to emit the RF excitation pulses and to receive MR signals, the T/R circuitry 132 may typically include a switching device for toggling the RF coil between active or transmitting mode, and passive or receiving mode. A power supply, denoted generally by reference numeral 124 in FIG. 1, is provided for energizing the primary magnet 114. Moreover, the scanner control circuitry 106 may include interface components 134 for exchanging configuration and image data with the system control circuitry 108. It should be noted that, while in the present description reference is made to a horizontal cylindrical bore imaging system employing a superconducting primary field magnet assembly, the present technique may be applied to various other configurations, such as scanners employing vertical fields generated by superconducting magnets, permanent magnets, electromagnets or combinations of these means.

The system control circuitry 108 may include a wide range of devices for facilitating interface between an operator or radiologist and the scanner 104 via the scanner control circuitry 106. In the illustrated embodiment, for example, an operator controller 136 is provided in the form of a computer workstation employing a general purpose or application-specific computer. The workstation also typically includes memory circuitry for storing examination pulse sequence descriptions, examination protocols, user and patient data, image data, both raw and processed, and so forth. Further, the workstation may further include various interface and peripheral drivers for receiving and exchanging data with local and remote devices. In the illustrated embodiment, such devices include a conventional computer keyboard 140 and an alternative input device such as a mouse 142. A printer 144 may be provided for generating hard copy output of documents and images reconstructed from the acquired data. Moreover, a computer monitor 138 may be provided for facilitating operator interface. In addition, the system 100 may include various local and remote image access and examination control devices, represented generally by reference numeral 146 in FIG. 1. Such devices may include picture archiving and communication systems, teleradiology systems, and the like.

Figure 2:
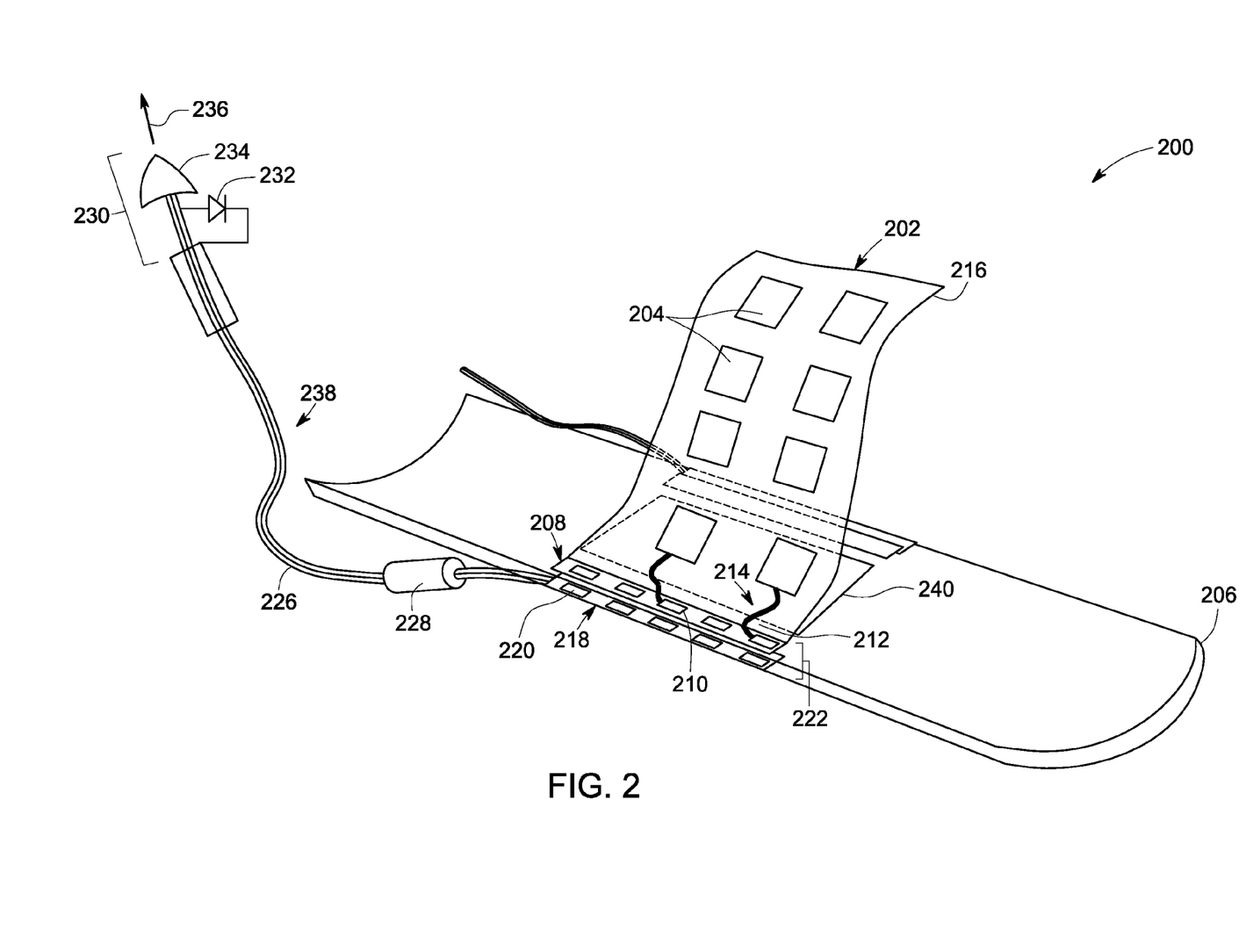
FIG. 2 is a diagrammatic illustration of a system for inductively communicating data, in accordance with aspects of the present disclosure.

As previously noted, MRI receiver coil arrays typically entail use of bulky cables that make it more difficult to position the MRI receiver coil arrays on a patient before initiating a scanning procedure. In accordance with aspects of the present application, an exemplary system 200 for inductively communicating data acquired by a first array of primary coils to other coils in an imaging system, such as the imaging system 100 of FIG. 1 that circumvents the shortcomings of the presently available techniques is presented.

The system 200 may include a first array of primary coils 202. The first array of primary coils 202 may include one or more primary coils 204. In one example, the first array of primary coils 202 may include MRI receive coils, such as the RF coils 122 (see FIG. 1). The first array of primary coils 202 may be configured to be disposed on or about a patient, such as the patient 102 (see FIG. 1). Moreover, the primary coils 204 may be configured to acquire data corresponding to a region of interest in the patient disposed on a patient support 206, such as the patient cradle 112 of FIG. 1. The primary coils 204 are configured to inductively communicate the acquired data to receiver electronics in the imaging system 100. Also, the terms patient support and patient cradle may be used interchangeably.

Furthermore, these primary or imaging coils 204 in the first array 202 may be operatively coupled to a second array of secondary coils 208. In one embodiment, the second array of secondary coils 208 may include an arrangement of one or more secondary coils 210. The secondary coils 210 may also be referred to as outrigger coils. Moreover, in one example, the imaging coils 204 in the first array of primary coils 202 may be operatively coupled to the outrigger coils 210 in the second array of secondary coils 208 via a first set of cables 212. It may be noted that these cables 212 may include cables having a short length. In one example, the term short cable may be used to refer to a cable having a length in a range from about 12 cm to about 32 cm. The data acquired by the primary coils 204 may be communicated to the outrigger coils 210 via the cable 212.

It may be noted that the first array of primary coils, the second array of secondary coils 208 and the first set of cables 212 may form an array of coil assemblies. By way of example, each primary coil 204, outrigger coil 210 and connecting cable 212 may generally be referred to in aggregate as a coil assembly and be represented by reference numeral 214. According to aspects of the present disclosure, the multiple coil assemblies 214 may be arrayed within the form of a blanket 216. To that end, a first flexible substrate may be provided, in one embodiment. Also, the first array of primary coils 202 may be disposed on the first flexible substrate. Also, in a presently contemplated configuration, the outrigger coils 210 may be disposed along an edge of the blanket 216 and operatively coupled to the primary coils 204 via cables 212. Moreover, in this embodiment of the blanket 216, an "edge" of the blanket refers to any portion proximate the perimeter of the blanket 216. Furthermore, in one embodiment, the coil assembly 214 may be disposed on the first flexible substrate. However, in certain other embodiments, the coil assembly 214 may be embedded in the first flexible substrate. The first flexible substrate may be formed using a thin dielectric material such as a polyimide film or FR-4.

Additionally, in one embodiment, if the patient 102 is disposed in a supine orientation, the blanket 216 may be draped over the patient 102 thereby forming an anterior array configured to acquire data from a region of interest in the patient 102. Further, in accordance with aspects of the present disclosure, the blanket 216 may be fashioned to have a wide variety of shapes. For example, the blanket 216 may have a circular shape, a square shape, a rectangular shape, a triangular shape, a polygonal shape, or combinations thereof. The blanket 216, in another embodiment, may be fashioned in the form of an article of clothing having the functional shape such as a vest, pants, skirt, or robe to be worn by the patient during the scanning procedure. For the blanket embodiment that is an article of clothing, the "edge" of the blanket refers to any of the perimeters of the clothing. Also, in accordance with further aspects of the present disclosure, more than one blanket may be disposed upon the patient 102 for the imaging applications. In one embodiment, the blanket 216 that includes the first array of primary coils 202 and the second array of secondary coils 208 may be secured to a side of the patient cradle 206.

In the embodiment of FIG. 2, the first array of primary coils 202 is disposed on or embedded in the blanket 216. In other embodiments, the first array of primary coils 202 may also embedded in the patient cradle 206 directly under the patient 102, thereby forming a posterior array 240. It may be noted that in certain embodiments, the system 200 may include one or more anterior arrays 216 and/or one or more posterior arrays 240 to facilitate imaging the patient 102.

Moreover, in another embodiment, the first array of primary coils 202 may be disposed upon the patient cradle 206. By way of example, the first array of primary coils 202 may be integrated into a mat. This mat may then be disposed on the patient cradle 206. Furthermore, as previously noted, the primary coils 204 in the first array of primary coils 202 are configured to acquire data from a supine patient 102, for example, positioned on the patient cradle 206 in a head first or feet first orientation during a scanning procedure. Moreover, in one non-limiting example, a number of primary coils 204 disposed in the patient cradle 206 may be in a range from about 16 to about 72. Specifically, the primary coils 204 in the first array of primary coils 202 are arranged such that the primary coils 204 cover the expanse of the patient cradle 206. It may also be noted that in certain embodiments, the system 200 may include another first array of primary coils in addition to the blanket of primary coils 216.

In accordance with aspects of the present disclosure, each coil assembly 214 can be made resonant by tuning capacitors on both the primary coils 204 and the outrigger coils 210. By way of example, each coil assembly 214 in the array of coil assemblies may be configured to be resonant at the Larmor frequency. As will be appreciated, the Larmor frequency is generally represented as:

$$\text{Larmor frequency} = \gamma B_o \tag{1}$$

where $\gamma$ is the gyromagnetic ratio and for typical proton imaging is generally represented as:

$$\gamma = 42.58 \frac{\text{MHz}}{T} \tag{2}$$

Furthermore, $B_o$ is representative of a static magnetic field in Tesla (T). By way of example, the Larmor frequency for a 1.5 T system is 63.87 MHz. Accordingly, in a 1.5 T MRI system the primary coils 204 and/or the secondary coils 210 will be resonant at about 63.87 MHz. In other embodiments, the coil assembly 214, which includes primary coil 204, the cable 212 and the outrigger coil 210, will be resonant at 63.87 MHz.

As will be appreciated, MRI coil arrays are typically coupled to receiver electronics via a multitude of cables and connectors. These cables and connectors tend to be large and heavy. Also, the number of cables and/or connectors becomes unwieldy as the number of coils increases. In addition, heating in the cables can lead to patient burns. To circumvent the shortcomings of the currently available MRI coil arrays, a connector-less coil array is presented. Particularly, in the connector-less coil array, the coils are proximity coupled through an air gap to receiver electronics in the imaging system 100.

In accordance with further aspects of the present disclosure, the system 200 may include a third array of tertiary coils 218 disposed on the patient cradle 206. The third array of tertiary coils 218 may include an arrangement of one or more tertiary coils 220, in one embodiment. Also, the terms tertiary coils and sniffer coils may be used interchangeably. Furthermore, in one embodiment, the sniffer coils 220 may be disposed on the patient cradle 206. In one example, the sniffer coils 220 may be disposed along one or more edges of the patient cradle 206. However, in certain other embodiments, the sniffer coils 220 may be embedded in the patient cradle 206.

Furthermore, in accordance with aspects of the present disclosure, an exemplary connector-less coil array is presented, where the outrigger coils 210 may be proximity coupled to the sniffer coils 220 through an air gap 222. The sniffer coils 222 may be configured to inductively receive data from the outrigger coils 210 across the air gap 222 without the use of any connecting cables. It may be noted that the sniffer coils 220 in the third array of tertiary coils 218 may be arranged on patient cradle 206. Moreover, in accordance with one embodiment, the third array of tertiary coils 218 is positioned in a fixed position. Specifically, in one embodiment, the third array of tertiary coils 218 may be positioned in a fixed position under the patient cradle 206 of the imaging system 100. However, in another embodiment, the third array of tertiary coils 218 may be positioned in a fixed position on the patient cradle 206 of the imaging system 100.

Also, in certain embodiments, a number of tertiary coils 220 in the third array of tertiary coils 218 is less than a number of primary coils 204 in the first array of primary coils 202 and/or the number of outrigger coils 210 in the second array of secondary coils 208. Additionally, in one embodiment, a size of the tertiary coils 220 is smaller than a size of the primary coils 204 and/or secondary coils 210. However, it may be noted that in certain embodiments, the size of the tertiary coils 220 may be substantially similar to the size of the secondary coils 210. In one example, the secondary and tertiary coils 210, 220 may include rectangular coils having dimensions of about 5 cm×5 cm. Also, these coils may be arranged in a linear array of 5 coils.

In accordance with aspects of the present disclosure, the tertiary coils 220 are disposed at a determined distance from the outrigger coils 210. In particular, the tertiary coils 220 may be disposed at a determined air gap 222 from the outrigger coils 210. By way of example, the sniffer coils 220 may be disposed at a distance from the outrigger coils 210 in a range from about 4 mm to about 70 mm. In one example, the determined gap between the outrigger coils 210 and the sniffer coils 220 may be about 25 mm.

With continuing reference to FIG. 2, data corresponding to a region of interest in the patient may be acquired by the primary coils 204 and transmitted to the outrigger coils 210. Furthermore, the acquired data may be inductively coupled from the outrigger coils 210 to the sniffer coils 220 over the air gap 222 without the use of any connecting cables. It is therefore desirable that the outrigger coils 210 are aligned with the sniffer coils 220 that are disposed in the patient cradle 206. To that end, one or more slots (see FIG. 5) may be formed in the patient cradle 206. These slots are configured to fixably couple the blanket 216 having one or more coil assemblies 214 to the patient cradle 206. Additionally, the slots aid in aligning the outrigger coils 210 with the sniffer coils 220. In one embodiment, one or more coupling means, such as, but not limited to, pegs, may be disposed along the edge of the blanket 216. Particularly, the pegs may be disposed at determined intervals along the edge of the blanket 216. These pegs may be inserted in the slots to align the outrigger coils 210 in the blanket 216 with the sniffer coils 220. Positioning the pegs in the slots aids in aligning the outrigger coils 210 with the sniffer coils 220, thereby enhancing the transfer of data from the outrigger coils 210 to the sniffer coils 220.

As will be appreciated, the patient cradle 206 is configured to move the patient 102 disposed thereon to aid in imaging a region of interest in the patient 102. Accordingly, the patient cradle 206 is configured to move in a longitudinal direction to aid in positioning the patient 102 at a desired location in the patient bore 110 of the imaging system 100. It may therefore be desirable for the outrigger coils 210 and the sniffer coils 220 to also move along with the patient cradle 206. In accordance with further aspects of the present disclosure, the outrigger coils 210 and the sniffer coils 220 may be configured to move with the patient cradle 206.

As previously noted, the data acquired by the primary coils 204 may be transmitted from the outrigger coils 210 to the sniffer coils 220 across the air gap 222 and without the use of any connecting cables. The sniffer coils 220 may be configured to transmit the received data to receiver electronics (not shown) in the imaging system 100 for further processing. Accordingly, a cable 226 having a first end and a second end may be coupled to the sniffer coils 220 to aid in the transmission of data from the sniffer coils 220 to the receiver electronics. In accordance with aspects of the present disclosure, an attenuating unit 228 may be coupled between the sniffer coils 220 and the first end of the cable connection 226 to attenuate any common mode signals. The attenuating unit 228 may include a balun, in one embodiment. Moreover, a length of the cable 226 from the sniffer coil 220 may be selected such that electrical length of the balun 228 and the cable 226 is a quarter wave at Larmor frequency. The quarter wave electrical length may be achieved via use of a coaxial cable, in certain embodiments. In other embodiments, the quarter wave electrical length may be implemented as a 90 degree phase shift using lumped element components.

In accordance with other aspects of the present disclosure, the system 200 may also include a tuning unit 230. The tuning unit 230 may be coupled at the second end of the cable 226. In one embodiment, the tuning unit 230 may include a diode 232 and a low-input-impedance preamplifier 234. Also, the tuning unit 230 may be located at a quarter wave electrical distance from the sniffer coils 220.

As previously noted, the data acquired by the primary coils 204 may be inductively coupled from the outrigger coils 210 to the sniffer coils 220 without the use of any cables. In accordance with aspects of the present disclosure, although there is no direct hard-wired connection between the sniffer coils 220 and the primary coils 204, the primary or imaging coils 204 may be controlled through impedance transformation. Specifically, each imaging coil 204 may be de-tuned for the well-being of the patient 102 during RF transmission via active blocking by adjusting the impedance of the sniffer coil 220. Moreover, current flow in the imaging coil 204 may be reduced to mitigate coil cross-talk during signal reception via preamplifier decoupling by adjusting the impedance of the sniffer coil 220. The impedance changes may be achieved respectively by activating the diode 232 and with the use of a low-input-impedance pre-amplifier 234 in the tuning unit 230 that is positioned at a quarter wave electrical distance from the sniffer coil 220. The impedance transformation of the coil assembly 214 by adjusting the impedance of the sniffer coils 220 will be described in greater detail with reference to FIGS. 4-7.

Moreover, the sniffer coils 220 are coupled to other electronics that aid in communicating the data received from the primary coils 204 to processing circuitry in the imaging system 100. By way of example, the sniffer coils 220 may be coupled to amplifiers (not shown), where the amplifiers are configured to amplify signals in the data received by the sniffer coils 220. Outputs of these amplifiers are then communicated to receivers in the imaging system 100, for example. Reference numeral 236 is generally representative of cables used for coupling the sniffer coils 220 to their respective channels. Also, reference numeral 238 is generally representative of a harness or cable bundle that is a collection of individual cables 226 from the sniffer coils 220.

Figure 3:
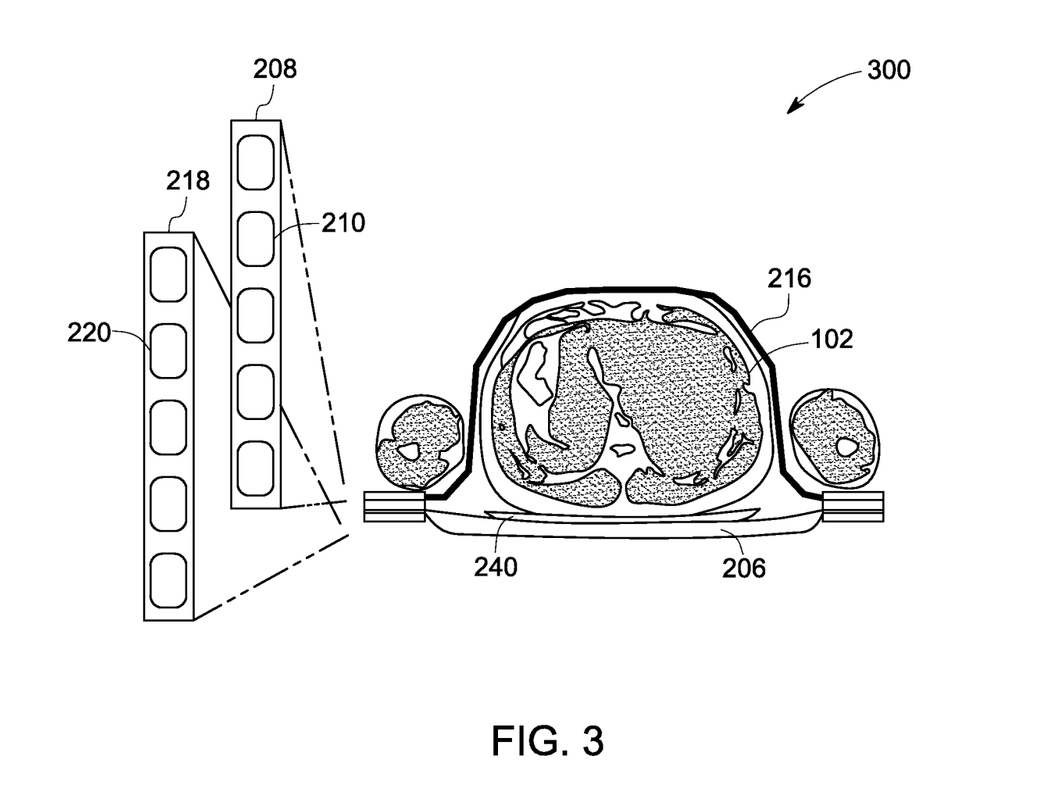
FIG. 3 is a diagrammatic illustration of cross-sectional end view of the system for inductively communicating data of FIG. 2, in accordance with aspects of the present disclosure.

Once the scanning procedure is initiated and as the patient cradle 206 is advanced into the imaging system 100 and more particularly into the patient bore 110 (see FIG. 1), signals representative of an anatomical region of the patient 102 are acquired by the primary coils 204. Subsequently, the acquired signals are inductively communicated from the outrigger coils 210 to the sniffer coils 220. Specifically, in accordance with aspects of the present disclosure, signals acquired by the primary coils 204 in the first array 202 are inductively transmitted from the outrigger coils 210 to the sniffer coils 220 without the use of any cabling. Furthermore, the signals received by the sniffer coils 220 are amplified by preamplifiers, for example, and the amplified signals are transmitted to the receivers (not shown) in the imaging system 100. FIG. 3 is a diagrammatical representation 300 that depicts a cross-sectional side view of the system 200 of FIG. 2.

Figure 4:
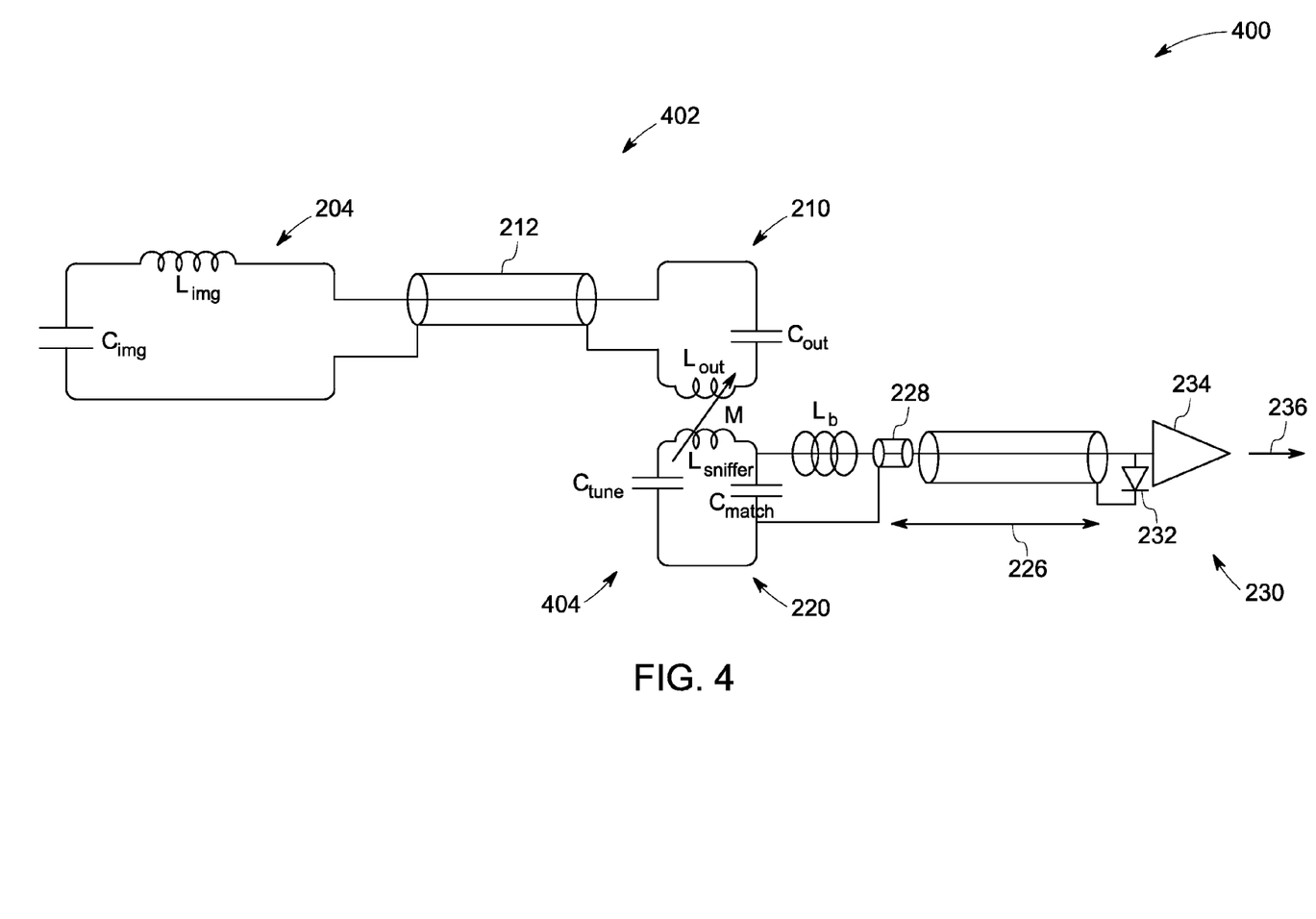
FIG. 4 is an equivalent circuit diagram representation of the system of FIG. 2, in accordance with aspects of the present disclosure.

Referring now to FIG. 4, a diagrammatic illustration 400 of a method of inductively transmitting data acquired by primary coils to other coils in an imaging system, such as the imaging system 100 of FIG. 1 is presented. FIG. 4 is described with reference to the elements of FIGS. 1-3. For example, the method of inductively communicating data acquired by the primary coils 204 in the first array 202 from the outrigger coils 210 to the sniffer coils 220 in the third array 218 is depicted. Reference numeral 402 is generally representative of an equivalent electronic circuit of the coil assembly 214 that includes the primary coils 204, the outrigger coils 210 and the cables 212. Similarly, an equivalent electronic circuit of the sniffer coil 220 is generally represented by reference numeral 404. It may be noted that certain components of the equivalent circuits are omitted for ease of illustration.

As depicted in FIG. 4, each primary or imaging coil 204 in the first array 202 is represented by a circuit that includes a loop with inductance $L_{img}$ and a first capacitor $G_{img}$. In a similar fashion, each secondary or outrigger coil 210 in the second array 208 is represented by a circuit that includes a loop with inductance $L_{out}$ and capacitor $C_{out}$. Moreover, each tertiary or sniffer coil 220 in the third array 218 is represented by a circuit that includes a loop with inductance $L_{sniffer}$ and capacitors $C_{tune}$ and $C_{match}$. As previously noted, the sniffer coil 220 is proximity coupled with the outrigger coil 210 with the air gap 222 therebetween, the two coils 210, 220 become inductively coupled and exhibit mutual inductance M. Additionally, the capacitor $C_{match}$ and inductor $L_b$ are used for impedance matching to the tuning circuit 230. The sniffer coil 220 is coupled to the tuning circuit 230, which in turn is coupled to a receiver (not shown in FIG. 4) via the transmission line 236. The transmission line 236 may have a coaxial or a stripline geometry. Also, the transmission line 236 may be disposed in plane of the sniffer coils 220 or offset slightly below the sniffer coils 220.

Furthermore, the coil assembly 214 having the primary coil 204, the outrigger coil 210 and the cable 212 together with the sniffer coil 220 may be configured to form a coupled resonant structure. The coil assembly 214 and more particularly the outrigger coil 210 is configured to emit RF magnetic flux, where the flux may link with a sniffer coil 220 that is disposed proximate to the outrigger coil 210. Specifically, the outrigger coil 210 is disposed at a determined distance (for example, the air gap 222) from the sniffer coil 220 so as to support enhanced signal transfer. The determined distance may be dependent upon a mechanical constraint. By way of example, the mechanical constraint may be representative of a need to maintain a desired air gap. Moreover, in one example, if the outrigger coils 210 and the sniffer coils 220 include circular coils, then the determined air gap may have a value that is substantially equal to about half the diameter of the circular coils. In another example, if the outrigger coils 210 and the sniffer coils 220 include square coils, then the determined air gap may have a value that is substantially equal to about half a side of the square coils. Accordingly, the signals acquired by the primary coils 204 are inductively transmitted from the outrigger coils 210 to the sniffer coils 220 without the use of any cables.

Although in the presently contemplated configuration of FIG. 4, there is no direct hard-wired connection between the imaging coils 204 and the sniffer coils 220 the imaging coil 204 may be controlled through impedance transformation. Specifically, the changes in the impedance of the sniffer coil 220 may be achieved via use of the diode 232 and the preamplifier 234 in the tuning circuit 230, where the diode 232 and the preamplifier 234 are placed at a quarter wave electrical distance from the sniffer coil 220. In particular, during RF transmission, the diode 232 in the tuning unit 230 may be activated with a direct current (DC) pulse or signal. The applied DC signal lowers the impedance of the diode 232, and this low impedance is transformed to a high impedance by the quarter wave section such that the impedance at $C_{match}$ and $L_b$ section appears high. The sniffer coil becomes resonant at 63.8 MHz as the reactance of $L_{sniffer}$ is cancelled by the reactance of $C_{tune}$ and $C_{match}$. The resonant sniffer coil 220 is now in close proximity to the resonant coil assembly 214, which includes the primary or imaging coil 204, the outrigger coil 210 and the cable 212. As will be appreciated, placing two resonant coils in close proximity de-tunes the two coils. Accordingly, the sniffer coil 220 de-tunes both the imaging coil 204 and the outrigger coil 210 in the coil assembly 214 as the imaging coil 204 and the outrigger coil 210 are connected by the cable 212. Consequently, the coil assembly 214 is de-tuned, thereby preventing the possibility of induced current from the transmit pulse.

In addition, current flow in the imaging coil 204 may be reduced to mitigate coil cross-talk during signal reception via preamplifier decoupling. In particular, the current flowing in the imaging coil 204 may be reduced by adjusting the impedance of the sniffer coil 220. During signal reception, the low-input-impedance preamplifier 234 may be used to reduce the impedance of the sniffer coil 220, which through impedance transformation, increases the impedance of the coil assembly 214. The increased impedance of the coil assembly 214 consequently results in a reduced current flow in the imaging coil 204 and thereby minimizes cross-talk with neighboring imaging coils.

Figure 5:
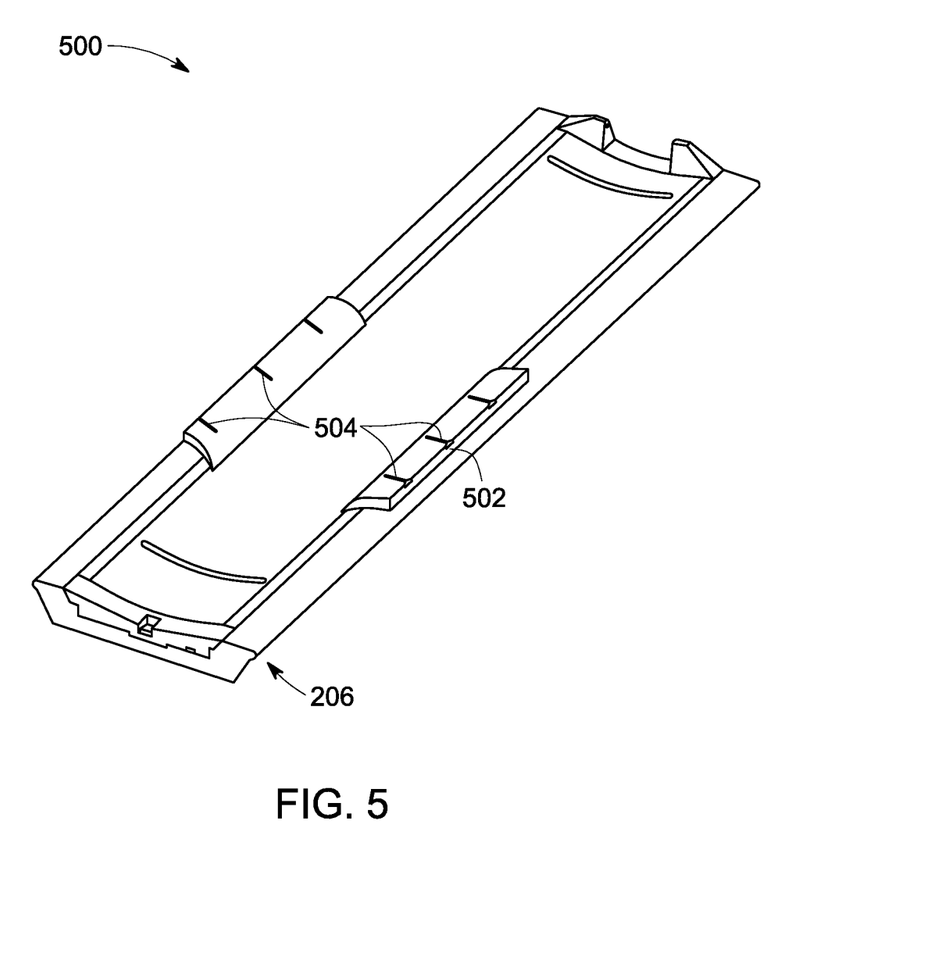
FIG. 5 is a diagrammatic illustration of means for aligning coils in the system for inductively communicating data of FIG. 2, in accordance with aspects of the present disclosure.

Turning now to FIG. 5, a diagrammatical representation 500 of means for aligning outrigger coils with sniffer coils is depicted. In the embodiment of FIG. 5, sniffer coils such as the sniffer coils 220 of FIG. 2 may be packaged into a housing that is disposed on the patient cradle 206 and configured to house the sniffer coils 220. In one embodiment, the housing may include one or more lateral extensions 502 that are coupled to a patient cradle 206. The lateral extensions 502 may also be referred to as gull wings.

As previously noted, it is desirable to align the outrigger coils 210 with the sniffer coils 220. To that end, in accordance with aspects of the present disclosure, one or more slots 504 may be formed on the gull wings 502. Moreover, one or more coupling means (not shown), such as, but not limited to, pegs may be disposed along the outrigger coils 210 in the second array of secondary coils 208. In one example, the pegs may be arranged along the edge of the blanket 216 (see FIG. 2) at determined intervals. These pegs may be employed to align the outrigger coils 210 with the sniffer coils 220. To that end, the pegs may be inserted into these slots 504. Consequently, the outrigger coils 210 may be aligned with the sniffer coils 220. Implementing the alignment of the outrigger coils 210 and the sniffer coils 220 as described hereinabove allows the outrigger coils 210 and the sniffer coils 220 to move with the patient cradle. Moreover, any cables running from the sniffer coils 220 may be routed inside the patient cradle 206 and thereby be configured to move with the patient cradle 206. Additionally, in certain other embodiments, the cables from the sniffer coils may be routed along or below the patient cradle 206. It may be noted that in certain embodiments, the sniffer coils 220 are arrayed in a fixed location under one or both sides of the patient cradle 206.

Figure 6:
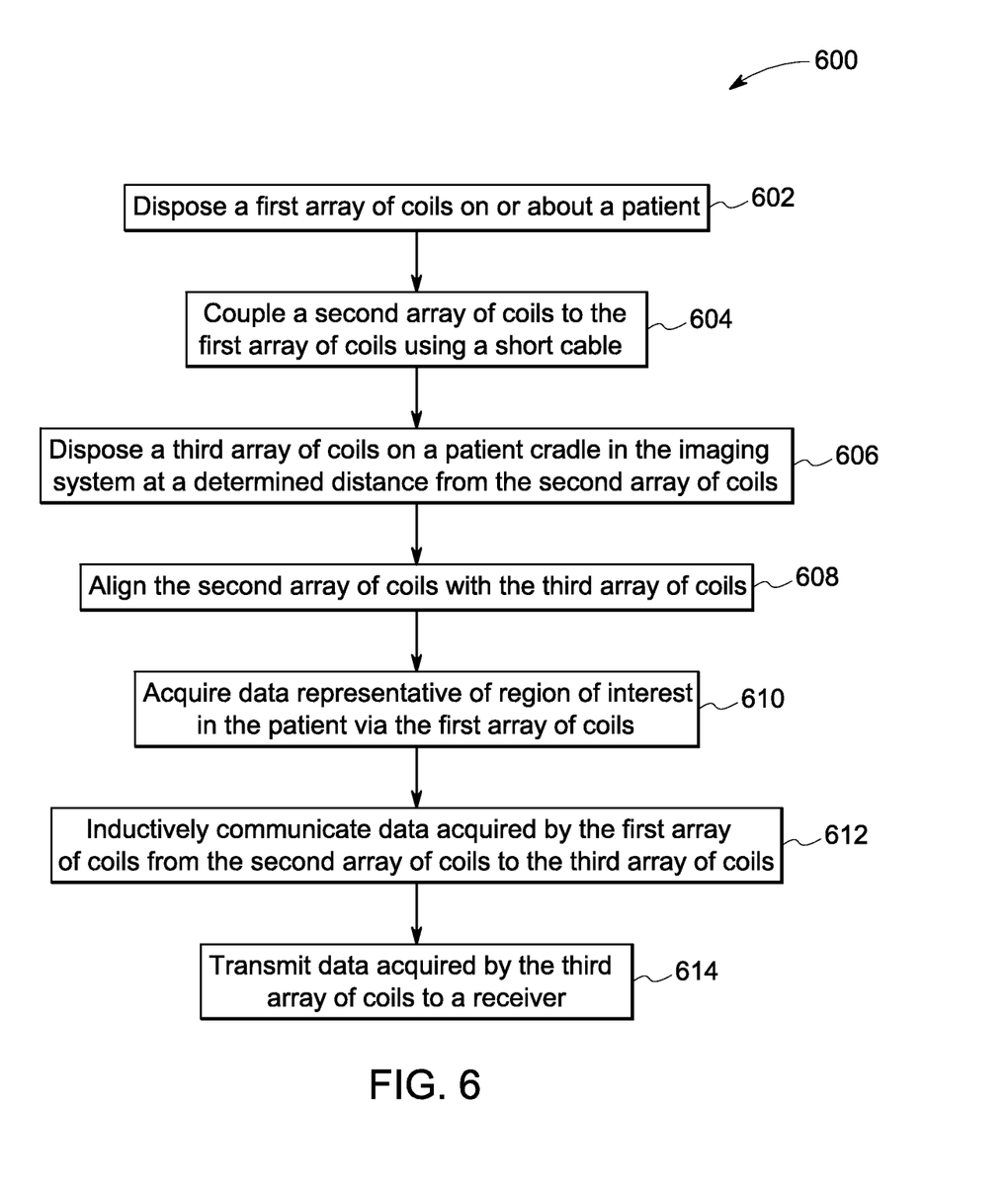
FIG. 6 is a flow chart depicting an exemplary method for inductively communicating data, in accordance with aspects of the present disclosure.

Furthermore, in accordance with aspects of the present disclosure, an exemplary method for inductively communicating signals from primary coils to sniffer coils is presented. Turning now to FIG. 6, a flowchart 600 illustrating an exemplary method for inductively communicating signals, in accordance with aspects of the present disclosure, depicted. The method of FIG. 6 is described with reference to elements of FIGS. 1-5.

The method starts at step 602, where a first array 202 of primary coils 204 is provided. Additionally, at step 604, a second array 206 of secondary coils 208 is provided, where the secondary coils 208 are operatively coupled to the primary coils 204 via short cables 212. In one embodiment, the primary coils 204 are embedded in or disposed on a first substrate to form the blanket 216. Additionally, the outrigger coils 208 are disposed along an edge of the blanket 216 and operatively coupled to the primary coils 204 via the short cables 212. This blanket 216 may then be disposed on or about the patient 102 positioned on the patient cradle 206. In certain other embodiments, the primary coils 204 are disposed on or embedded in the patient cradle 206.

Subsequently, as indicated by step 606, a third array 218 of sniffer coils 220 is provided. In particular, the third array of tertiary coils 218 is disposed at a determined air gap 222 from the second array of coils 208. Also, in one embodiment, the sniffer coils 220 of the third array 218 are disposed on the patient cradle 206.

In addition, it is desirable that the second array of coils 208 be aligned with the third array of tertiary coils 218 to facilitate enhanced transmission of data acquired by the primary coils 204 from the outrigger coils 210 to the sniffer coils 220, as indicated by step 608. To that end, one or more gull wings 502 may be disposed on the patient cradle 206, where the gull wings 502 are configured to house the sniffer coils 220. Moreover, one or more slots 504 may be provided on the gull wings 502 on the patient cradle 206. Furthermore, in one embodiment, coupling means such as pegs may be arranged along the outrigger coils 210 in the second array of secondary coils 208. By way of example, the pegs may be arranged at determined intervals along the edge of the blanket 216. These pegs may be inserted in the slots 504, thereby aligning the outrigger coils 210 with the sniffer coils 220.

Furthermore, as indicated by step 610, data corresponding to a region of interest may be acquired during the scanning procedure. Accordingly, the blanket 216 may be disposed on the patient 102, where the patient 102 is positioned on the patient cradle 206. Subsequently, data corresponding to a region of interest in the patient 102 may then be acquired during the scanning procedure. To that end, the patient cradle 206 may be advanced into the imaging system 100 to aid in the acquisition of data from the patient.

Moreover, at step 612, the data acquired by the primary coils 204 may be inductively coupled from the outrigger coils 210 that are operatively coupled to the primary coils 204 to the sniffer coils 220 across the air gap 222. In particular, the outrigger coils 210 and the sniffer coils 220 become inductively coupled and exhibit mutual inductance M. Additionally, the capacitor $C_{match}$ and $L_b$ are used for impedance matching to the tuning circuit 230.

Furthermore, the coil assembly 214 that includes the primary coil 204, the outrigger coil 214 and the cable 212 together with the sniffer coil 222 form a coupled resonant structure. The coil assembly 214 and more particularly the outrigger coil 210 is configured to emit RF magnetic flux, where the flux may link with a sniffer coil 220 that is disposed proximate to the outrigger coil 210. Specifically, the outrigger coil 210 is disposed at a determined distance (air gap) from the sniffer coil 220 so as to support enhanced signal transfer. Thus, the signals acquired by the primary coils 204 are inductively transmitted from the outrigger coils 210 to the sniffer coils 220 without the use of cables.

Additionally, although there is no direct hard-wired coupling between the primary coils 204 and the sniffer coils 220, the imaging coil 204 may be controlled through impedance transformation. The imaging coil 204 may be de-tuned during RF transmission via active transmit blocking. In particular, during RF transmission, the diode 232 in the tuning unit 230 may be activated with a direct current (DC) pulse. The activation of the diode 232 creates a low impedance at the sniffer coil 220, which is transformed to a high impedance in the coil assembly 214, thereby detuning the coil assembly 214 and preventing the possibility of induced current from the transmit pulse.

Furthermore, current flow in the imaging coil 204 may be reduced to mitigate coil cross-talk during signal reception via preamplifier decoupling by adjusting the impedance of the sniffer coil 220. Also, the low-input-impedance preamplifier 234 may be used to reduce the impedance of the sniffer coil 220, which through impedance transformation, increases the impedance of the coil assembly 214 during the course of signal reception. The increased impedance of the coil assembly 214 consequently results in a reduced current flow and thereby minimizes cross-talk with neighboring imaging coils. Moreover, the data received by the sniffer coil 220 may be transmitted to receiver electronics via the transmission line, as indicated by step 614.

Furthermore, the foregoing examples, demonstrations, and process steps such as those that may be performed by the imaging system 100, may be implemented by suitable code on a processor-based system, such as a general-purpose or special-purpose computer. It should also be noted that different implementations of the present disclosure may perform some or all of the steps described herein in different orders or substantially concurrently, that is, in parallel. Furthermore, the functions may be implemented in a variety of programming languages, including but not limited to C++ or Java. Such code may be stored or adapted for storage on one or more tangible, machine readable media, such as on data repository chips, local or remote hard disks, optical disks (that is, CDs or DVDs), memory or other media, which may be accessed by a processor-based system to execute the stored code. Note that the tangible media may comprise paper or another suitable medium upon which the instructions are printed. For instance, the instructions may be electronically captured via optical scanning of the paper or other medium, then compiled, interpreted or otherwise processed in a suitable manner if necessary, and then stored in a data repository or memory.

The methods for inductively communicating MRI signals and the systems for inductively communicating signals described hereinabove dramatically enhance the performance of the imaging system. Particularly, use of inductive coupling for communicating signals from the primary coils to the sniffer coils obviates the use of active elements on or near the coils, thereby circumventing the need for supplying power to the active elements.

Moreover, a connector-less coil array is presented, where the coils are proximity coupled through an air gap to receiver electronics. In addition, the imaging coil is controlled through impedance transformation even in the absence of any hard-wired connections between the imaging coils and the sniffer coils. Specifically, the imaging coil is de-tuned during RF transmission via wireless active blocking, and coil cross-talk during signal reception is reduced via wireless preamplifier decoupling by adjusting the impedance of the sniffer coil. Additionally, the outrigger coils are aligned with the sniffer coils, thereby enhancing the transfer of data from the outrigger coils to the sniffer coils.

Additionally, the connector-less coil array provides an array having a lower weight due to the removal of long cables and active components (for example, preamplifiers) from the array. Moreover, patient throughput may be enhanced due to the use of reduced number of cables. Furthermore, the need for bulky cable baluns used to block common-mode currents in cables is also minimized or eliminated, thereby also reducing the significant amounts of heat dissipated by the bulky cable baluns. In addition, reducing the number of preamplifiers, cables, baluns, and switches in the patient cradle also reduces cost and complexity of the imaging system, while enhancing patient comfort. Also, clinical workflow may be enhanced due to faster coil placement. The system also provides a more robust coil interface.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system for inductively communicating signals in a magnetic resonance imaging system, the system comprising:
    a first array of primary coils configured to acquire data from a patient positioned on a patient cradle;
    a second array of secondary coils operatively coupled to the first array of primary coils;
    a third array of tertiary coils disposed at a determined distance from the second array of secondary coils; and
    a tuning unit operatively coupled to the third array of tertiary coils by a cable having a quarter-wave electrical wavelength and configured to control the first array of primary coils through impedance transformation,
    wherein the second array of secondary coils is configured to inductively communicate the acquired data to the third array of tertiary coils.

2. The system of claim 1, wherein the first array of primary coils is disposed on or embedded in a flexible substrate.

3. The system of claim 2, wherein the second array of secondary coils is disposed on or embedded in the flexible substrate and operatively coupled to the first array of primary coils via a first set of cables.

4. The system of claim 1, wherein the first array of primary coils is disposed on a patient, disposed on or embedded in the patient cradle such that the first array of primary coils is disposed directly under the patient, or combinations thereof.

5. The system of claim 1, wherein the first array of primary coils, the second array of secondary coils and the first set of cables form an array of coil assemblies.

6. The system of claim 5, wherein each coil assembly in the array of coil assemblies is tuned to the Larmor frequency.

7. The system of claim 1, wherein the determined distance comprises an air gap between the secondary coils and the tertiary coils.

8. The system of claim 1, wherein the patient cradle comprises a housing configured to house the tertiary coils.

9. The system of claim 8, further comprising one or more slots formed on the housing.

10. The system of claim 9, wherein the second array of secondary coils is fixably coupled to the one or more slots on the housing to align the secondary coils with the tertiary coils.

11. The system of claim 10, wherein the second array of secondary coils and the third array of tertiary coils are configured to move with the patient cradle.

12. The system of claim 1, wherein the tertiary coils are positioned at a fixed location underneath the patient cradle.

13. The system of claim 1, further comprising an attenuating unit operatively coupled to the third array of tertiary coils and configured to attenuate common mode signals.

14. The system of claim 1, wherein the secondary coils are configured to receive signals from at least one subset of primary coils.

15. The system of claim 14, wherein the second array of secondary coils is configured to inductively transmit the data received from the at least one subset of primary coils to the tertiary coils across the determined distance.

16. The system of claim 15, wherein the third array of tertiary coils is configured to communicate the signals received from the second array of secondary coils to receivers in the imaging system.

17. The system of claim 1, wherein the tuning unit comprises a diode and a low input impedance preamplifier.

18. The system of claim 1, wherein the tuning unit is configured to detune the primary coils during radio-frequency transmission via wireless active blocking.

19. The system of claim 1, wherein the tuning unit is configured to reduce cross-talk across the primary coils during radio-frequency signal reception via wireless preamplifier decoupling.

20. A method for inductively communicating signals in a magnetic resonance imaging system, the method comprising:
    disposing a first array of primary coils on or about a patient, wherein the first array of primary coils is configured to acquire signals from the patient positioned on a patient cradle;
    operatively coupling a second array of secondary coils to the first array of primary coils;
    disposing a third array of tertiary coils on the patient cradle such that the third array of tertiary coils is disposed at a determined distance from the second array of secondary coils; and
    inductively communicating the signals acquired by the first array of primary coils from the second array of secondary coils to the third array of tertiary coils;
    further comprising controlling the primary coils during radio-frequency transmission and signal reception via impedance transformation of the tertiary coils.

21. The method of claim 20, wherein disposing the first array of primary coils comprises arranging the primary coils on or embedding the primary coils in a flexible substrate.

22. The method of claim 21, further comprising disposing the second array of secondary coils along an edge of the flexible substrate and operatively coupling the secondary coils to the primary coils via a first set of cables.

23. The method of claim 20, further comprising:
forming one or one or more slots on a housing disposed on the patient cradle and configured to house the tertiary coils; and
fixably coupling the secondary coils to the one or more slots to align the secondary coils with the tertiary coils, wherein the secondary coils and the tertiary coils are configured to move with the patient cradle.

24. The method of claim 20, wherein the secondary coils are configured to receive signals from at least one subset of the primary coils.

25. The method of claim 20, wherein controlling the primary coils comprises detuning the primary coils during radio-frequency transmission via wireless active blocking.

26. The method of claim 20, wherein controlling the primary coils comprises reducing cross-talk across the primary coils during radio-frequency signal reception via wireless preamplifier decoupling.

27. The method of claim 20, further comprising coupling the tertiary coils in the third array of tertiary coils to preamplifiers to amplify the received signals.

28. The method of claim 27, further comprising communicating outputs of the preamplifiers to one or more receivers in the imaging system.

29. A system for magnetic resonance imaging, comprising:
an acquisition subsystem configured to acquire image data, wherein the acquisition subsystem comprises:
a subsystem for inductively communicating data signals in the imaging system, the subsystem comprising:
a first array of primary coils configured to acquire data from a patient positioned on a patient cradle;
a second array of secondary coils operatively coupled to the first array of primary coils;
a third array of tertiary coils disposed at a determined distance from the second array of secondary coils;
a tuning unit operatively coupled to the third array of tertiary coils by a cable having a quarter-wave electrical wavelength and configured to control the first array of primary coils through impedance transformation,
wherein the second array of secondary coils is configured to inductively communicate the acquired data to the third array of tertiary coils; and
a processing subsystem in operative association with the acquisition subsystem and configured to process the acquired image data.

30. The system of claim 29, wherein the tuning unit is configured to control the primary coils by:
detuning the primary coils during radio-frequency transmission via wireless active blocking; and
reducing cross-talk across primary coils during radio-frequency signal reception via wireless preamplifier decoupling.

\* \* \* \* \*